United States Patent
Sun

(10) Patent No.: US 11,011,725 B2
(45) Date of Patent: May 18, 2021

(54) DISPLAY PANEL AND MASK PLATE HAVING A THROUGH HOLE PENETRATING CATHODE LAYER

(71) Applicant: WUHAN CHINA STAR OPTOELECTRONICS SEMICONDUCTOR DISPLAY TECHNOLOGY CO., LTD., Wuhan (CN)

(72) Inventor: Jiajia Sun, Wuhan (CN)

(*) Notice: Subject to any disclaimer, the term of this patent is extended or adjusted under 35 U.S.C. 154(b) by 56 days.

(21) Appl. No.: 16/496,966

(22) PCT Filed: Aug. 28, 2019

(86) PCT No.: PCT/CN2019/102932
§ 371 (c)(1),
(2) Date: Sep. 24, 2019

(87) PCT Pub. No.: WO2020/258489
PCT Pub. Date: Dec. 30, 2020

(65) Prior Publication Data
US 2020/0403177 A1    Dec. 24, 2020

(30) Foreign Application Priority Data
Jun. 24, 2019  (CN) .......................... 201910549317.3

(51) Int. Cl.
| H01L 51/52 | (2006.01) |
| H01L 51/56 | (2006.01) |
| H01L 51/00 | (2006.01) |
| H01L 27/32 | (2006.01) |

(52) U.S. Cl.
CPC ...... *H01L 51/5225* (2013.01); *H01L 51/5253* (2013.01); *H01L 51/56* (2013.01); *H01L 27/3244* (2013.01); *H01L 51/0021* (2013.01); *H01L 51/0097* (2013.01)

(58) Field of Classification Search
CPC .. H01L 51/5225; H01L 51/5253; H01L 51/56
See application file for complete search history.

(56) References Cited

U.S. PATENT DOCUMENTS

| 5,892,562 A * | 4/1999 | Yamazaki ......... G02F 1/134363 349/141 |
| 7,710,027 B2 * | 5/2010 | Kobayashi .......... H01L 51/5262 313/506 |
| 9,054,195 B2 * | 6/2015 | Liu .................... H01L 27/1225 |

(Continued)

FOREIGN PATENT DOCUMENTS

| CN | 107658332 A | 2/2018 |
| CN | 108520921 A | 9/2018 |

(Continued)

*Primary Examiner* — Ida M Soward

(57) ABSTRACT

A display panel and a mask plate are provided. The display panel includes a base substrate, a thin film transistor substrate disposed on the base substrate, a light-emitting layer disposed on the thin film transistor substrate, a cathode layer disposed on the light-emitting layer, a covering layer and a protective layer laminated on the cathode layer, and an encapsulation layer disposed on the protective layer. Wherein, the cathode layer is provided with a through hole penetrating the cathode layer, and the through hole is filled with a transparent layer.

19 Claims, 11 Drawing Sheets

(56) References Cited

U.S. PATENT DOCUMENTS

| | | | |
|---|---|---|---|
| 9,588,375 B2* | 3/2017 | Yun | G02F 1/133377 |
| 10,451,914 B2* | 10/2019 | Kim | G02F 1/133516 |
| 10,678,091 B2* | 6/2020 | Lee | G02F 1/133512 |
| 2012/0206916 A1* | 8/2012 | Ohta | H01L 51/5275 |
| | | | 362/238 |
| 2015/0008414 A1* | 1/2015 | Isobe | H01L 27/3276 |
| | | | 257/40 |
| 2019/0123115 A1 | 4/2019 | Sun et al. | |
| 2019/0363296 A1 | 11/2019 | Wang et al. | |
| 2020/0135933 A1* | 4/2020 | Misaki | H01L 21/465 |
| 2020/0219423 A1* | 7/2020 | Okabe | G09F 9/301 |

FOREIGN PATENT DOCUMENTS

| | | |
|---|---|---|
| CN | 109273494 A | 1/2019 |
| CN | 109873015 A | 6/2019 |

* cited by examiner

DISPLAY PANEL AND MASK PLATE HAVING A THROUGH HOLE PENETRATING CATHODE LAYER

FIELD OF INVENTION

The present invention relates to the field of display technologies, and in particular, to a display panel and a mask plate.

BACKGROUND OF INVENTION

Compared with conventional liquid crystal displays (LCDs), organic light-emitting diode (OLED) devices have advantages of light weight, wide viewing angles, fast response time, low temperature resistance, and high luminous efficiency. Therefore, they have been regarded as the next generation of new display technologies in the display industry. To improve screen ratio of OLED panels, panel manufacturers have successively launched notched screens, water drop screens, tear-dropped screens, and other products.

As shown in FIG. 1, an OLED display panel is characterized in that an O-shaped hole 10 is designed in a non-edge display area, and a camera, an infrared sensor, an earpiece, and the like can be placed under the O-shaped hole 10. The position of the O-shaped hole 10 can be arbitrarily disposed by design, which can be used for position flexibility of the camera, the infrared sensor, the earpiece, and the like in the display area of the panel.

However, due to low transmittance of a part of film layers in OLED panels such as cathodes, the loss of external light after passing through the O-shaped area is large, which ultimately prevents the camera and other modules from forming images clearly.

Technical Problem

Due to low transmittance of a part of film layers in OLED panels, modules such as a camera cannot form images clearly.

SUMMARY OF INVENTION

Technical Solution

A display panel, including:
a base substrate;
a thin film transistor substrate disposed on the base substrate;
a light-emitting layer disposed on the thin film transistor substrate;
a cathode layer disposed on the light-emitting layer, wherein the cathode layer is provided with a through hole penetrating the cathode layer;
a covering layer and a protective layer laminated on the cathode layer; and
an encapsulation layer disposed on the protective layer, wherein the through hole is filled with a transparent layer, the base substrate is a transparent base substrate, and the base substrate is made of transparent plastic or ultra-thin flexible glass.

Further, a portion of the covering layer is filled in the through hole to serve as the transparent layer.

Further, the through hole is through the covering layer, and a portion of the protective layer is filled in the through hole to serve as the transparent layer.

Further, the through hole is through the covering layer and the protective layer, and a portion of the encapsulation layer is filled in the through hole to serve as the transparent layer.

Further, a thickness of the base substrate at a position corresponding to the through hole is less than a thickness of another portion of the base substrate.

A display panel, including:
a base substrate;
a thin film transistor substrate disposed on the base substrate;
a light-emitting layer disposed on the thin film transistor substrate;
a cathode layer disposed on the light-emitting layer, wherein the cathode layer is provided with a through hole penetrating the cathode layer;
a covering layer and a protective layer laminated on the cathode layer; and
an encapsulation layer disposed on the protective layer, wherein the through hole is filled with a transparent layer.

Further, a portion of the covering layer is filled in the through hole to serve as the transparent layer.

Further, the through hole is through the covering layer, and a portion of the protective layer is filled in the through hole to serve as the transparent layer.

Further, the through hole is through the covering layer and the protective layer, and a portion of the encapsulation layer is filled in the through hole to serve as the transparent layer.

Further, a thickness of the base substrate at a position corresponding to the through hole is less than a thickness of another portion of the substrate.

The present invention further provides a mask plate used for fabricating a display panel, wherein the display panel includes:
a base substrate;
a thin film transistor substrate disposed on the base substrate;
a light-emitting layer disposed on the thin film transistor substrate;
a cathode layer disposed on the light-emitting layer, wherein the cathode layer is provided with a through hole penetrating the cathode layer;
a covering layer and a protective layer laminated on the cathode layer; and
an encapsulation layer disposed on the protective layer, wherein the through hole is filled with a transparent layer; and
wherein the mask plate includes a frame with ring-shaped, a blocking piece positioned in a region enclosed by the frame and corresponding to the through hole, and a connecting portion connecting the frame with the blocking piece, wherein the blocking piece includes a laminating surface, and a side of the frame at the same side as the laminating surface is on the same level as the laminating surface.

Further, the connecting portion includes at least one connecting strip, an end of the connecting strip is fixedly connected to the blocking piece, the other end is fixedly connected to the frame, and each connecting strip protrudes away from the laminating surface.

Further, a connection point between each connecting strip and the blocking piece is positioned on a side of the blocking piece away from the laminating surface, and a connection point between each connecting strip and the frame is positioned on a side of the frame away from the laminating surface.

Further, each edge of the frame is connected to at least one of the connecting strips.

Further, the mask plate further including an auxiliary support bar, wherein an end of the auxiliary support bar is fixedly connected to one of the connecting strips, and the other end of the auxiliary support bar is connected to another connecting strip.

Further, a portion of the covering layer is filled in the through hole to serve as the transparent layer.

Further, a through hole is through the covering layer, and a portion of the protective layer is filled in the through hole to serve as the transparent layer.

Further, a through hole is through the covering layer and the protective layer, and a portion of the encapsulation layer is filled in the through hole to serve as the transparent layer.

Further, a thickness of the substrate at a position corresponding to the through hole is less than a thickness of another portion of the substrate.

Beneficial Effect

When the vapor deposition process is performed using a mask plate to form one or more layers of a cathode layer, a covering layer, and a protective layer, the vapor deposition material is not deposited at the preset position by the mask plate, and the film layers can be formed normally in other areas. Thereby enhancing light transmittance at the preset position, so that optical components such as the camera can be clearly imaged, which is simple and easy, and has great feasibility. Meanwhile, the mask plate is used to complete the vapor deposition process of one or more of the cathode layer, the covering layer, and the protective layer, so that etching openings are not required to be formed on the formed film layers, that is, the fabricating process of the encapsulation layer is not changed, therefore encapsulation reliability at the preset position is not reduced.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

Figure 1:
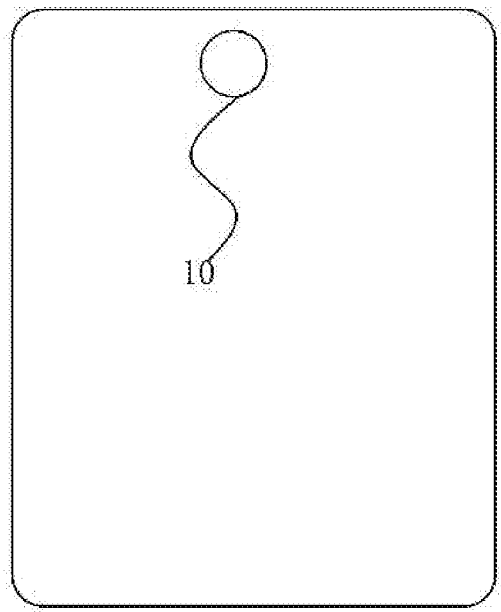
FIG. 1 is a schematic diagram of an organic light-emitting diode (OLED) display panel in the prior art of the present invention.

10, O-shaped hole;
21, frame; 22, blocking piece; 221, laminating surface; 23, connecting strip; 231, first connecting strip; 232, second connecting strip; 233, third connecting strip; 234, fourth connecting strip; 24, auxiliary support bar;
31, base substrate; 32, thin film transistor substrate; 33, light-emitting layer; 331, hole injection layer; 332, hole transport layer; 333, luminescent material layer; 334, electron transport layer; 335, electron injection layer; 34, cathode layer; 35, covering layer; 36, protective layer; 37, encapsulation layer; 371, first inorganic layer; 372, organic layer; 373, second inorganic layer; 38, optical component; 39, through hole.

DETAILED DESCRIPTION OF EMBODIMENTS

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

The invention is directed to technical problem of conventional organic light-emitting diode (OLED) display panels that due to transmittance of a part of the film layers in the panel is low such as a cathode, the loss of external light after passing through the O-shaped area is large, which eventually prevents a camera module or the like from forming images clearly. The present invention can solve the aforementioned problems.

Embodiment 1

Figure 2:
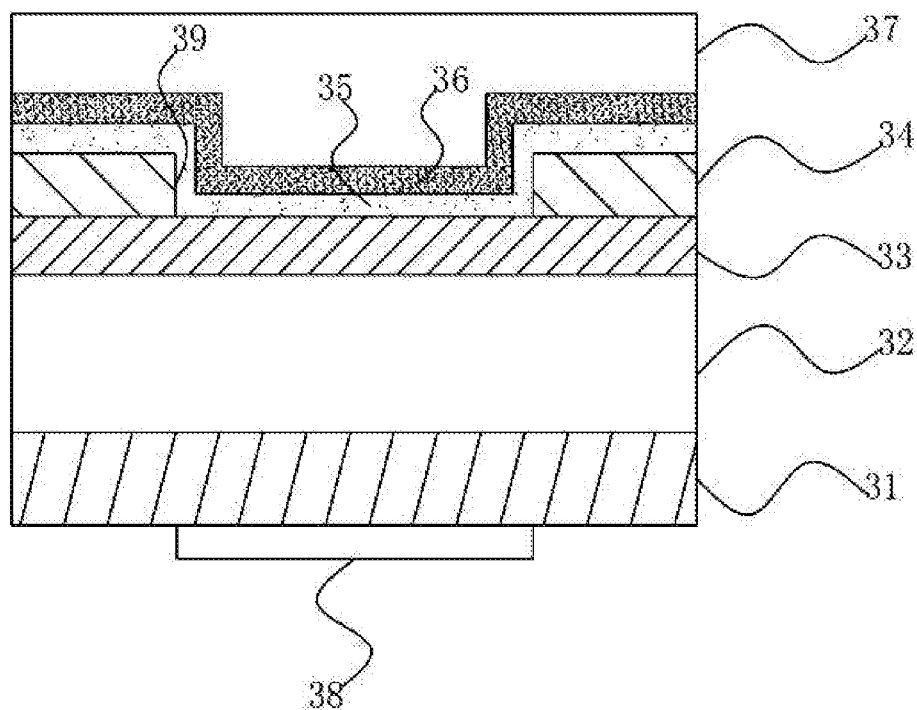
FIG. 2 is a schematic structural diagram of a display panel according to an embodiment 1 of the present invention.

A display panel is an OLED display panel. As shown in FIG. 2, the display panel includes a base substrate 31, an optical component 38, a thin film transistor substrate 32 disposed on the base substrate 31, a light-emitting layer 33 disposed on the thin film transistor substrate 32, a cathode layer 34 disposed on the light-emitting layer 33, a covering layer 35 and a protective layer 36 laminated on the cathode layer 34, and an encapsulation layer 37 disposed on the protective layer 36.

The base substrate 31 is a transparent substrate, and the base substrate is made of transparent plastic or ultra-thin flexible glass.

A through hole 39 penetrating the cathode layer 34 is disposed at a position corresponding to the optical component 38 on the cathode layer 34, and the through hole 39 is filled with a transparent layer.

By providing the through hole 39 at a position corresponding to the optical component 38 on the cathode layer 34 and filling the transparent layer, light transmittance at the position corresponding to the optical component 38 on the cathode layer 34 is enhanced, thereby causing the optical component 38 such as a camera to form images clearly, which is simple and easily feasible.

A portion of the covering layer 35 fills the through hole 39 to serve as the transparent layer, that is, the transparent layer is integrally formed with the covering layer 35. After the cathode layer 34 having the through hole 39 is formed by the vapor deposition process, while the covering layer 35 is forming, a portion of the covering layer 35 fills the through hole 39 to serve as the transparent layer.

The covering layer 35 is a transparent film layer made of caprolactam, and the protective layer 36 is a transparent film layer made of lithium fluoride.

Figure 3:
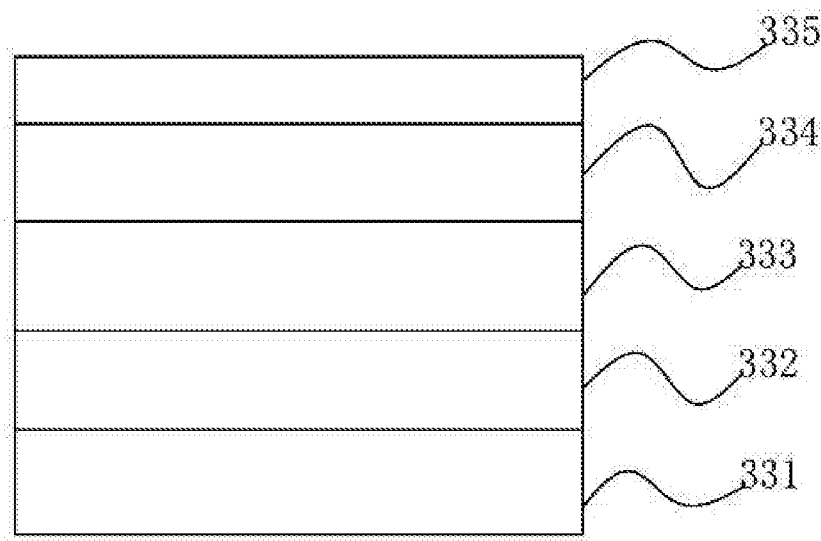
FIG. 3 is a schematic diagram of a layer structure of a light-emitting layer according to the embodiment 1 of the present invention.

As shown in FIG. 3, in an embodiment, the light-emitting layer 33 includes a hole injection layer 331, a hole transport layer 332, a luminescent material layer 333, an electron transport layer 334, and an electron injection layer 335 which are sequentially stacked.

Figure 4:
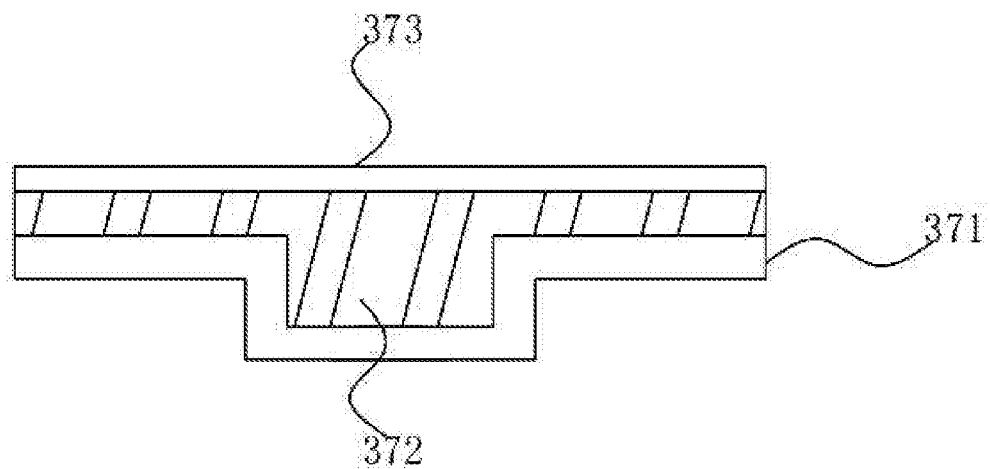
FIG. 4 is a schematic diagram of a layer structure of an encapsulation layer according to the embodiment 1 of the present invention.

As shown in FIG. 4, in an embodiment, the encapsulation layer 37 includes a first inorganic layer 371, an organic layer 372, and a second inorganic layer 373 which are sequentially stacked.

Embodiment 2

Figure 5:
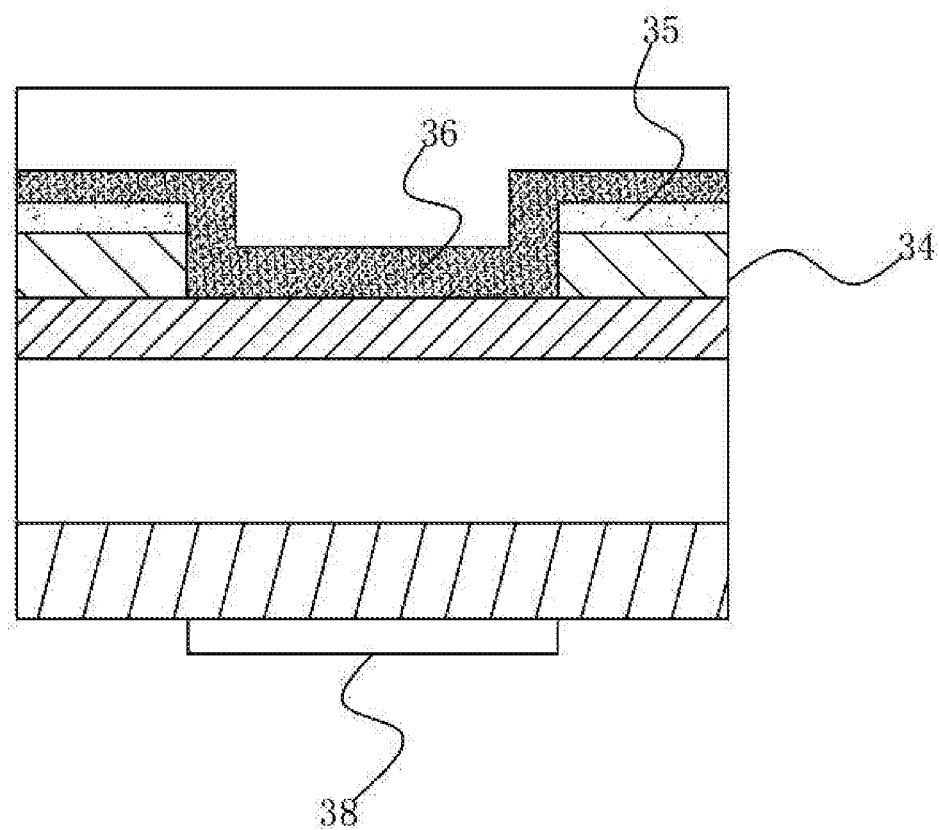
FIG. 5 is a schematic structural diagram of a display panel according to an embodiment 2 of the present invention.

A display panel, as shown in FIG. 5, which differs from the embodiment 1 in that the through hole 39 penetrates the covering layer 35, and a portion of the protective layer 36 fills the through hole 39 to serve as a transparent layer, that is, the transparent layer is integrally formed with the protective layer 36.

After the cathode layer 34 having the through holes 39 and the covering layer 35 are formed by a vapor deposition process, while the protective layer 36 is forming, a portion of the protective layer 36 fills the through holes 39 to serve as the transparent layer.

Embodiment 3

Figure 6:
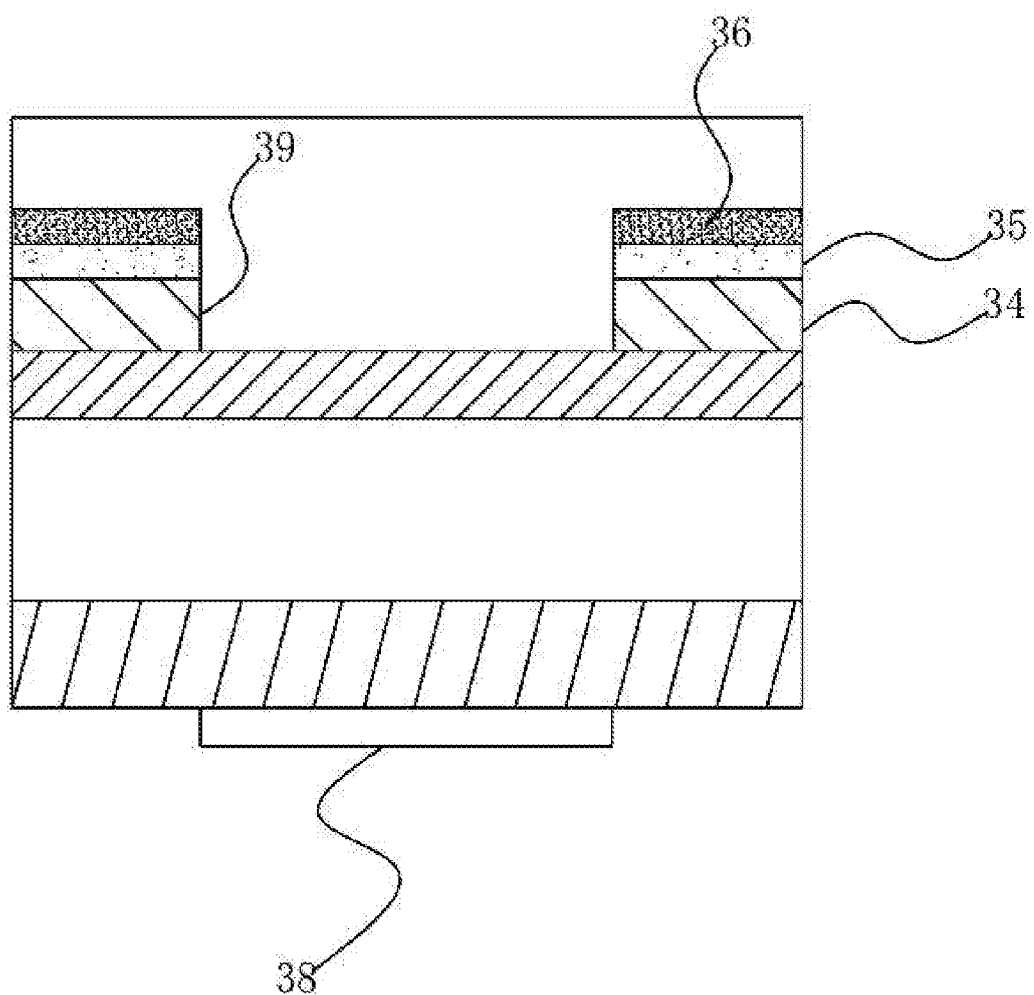
FIG. 6 is a schematic structural diagram of a display panel according to an embodiment 3 of the present invention.

A display panel, as shown in FIG. 6, which differs from the embodiment 1 in that the through hole 39 penetrates the covering layer 35 and the protective layer 36, and a portion of the encapsulation layer 37 fills the through holes 39 to serve as a transparent layer.

In an embodiment, the first inorganic layer 371 fills the through hole 39 to serve as the transparent layer.

Embodiment 4

Figure 7:
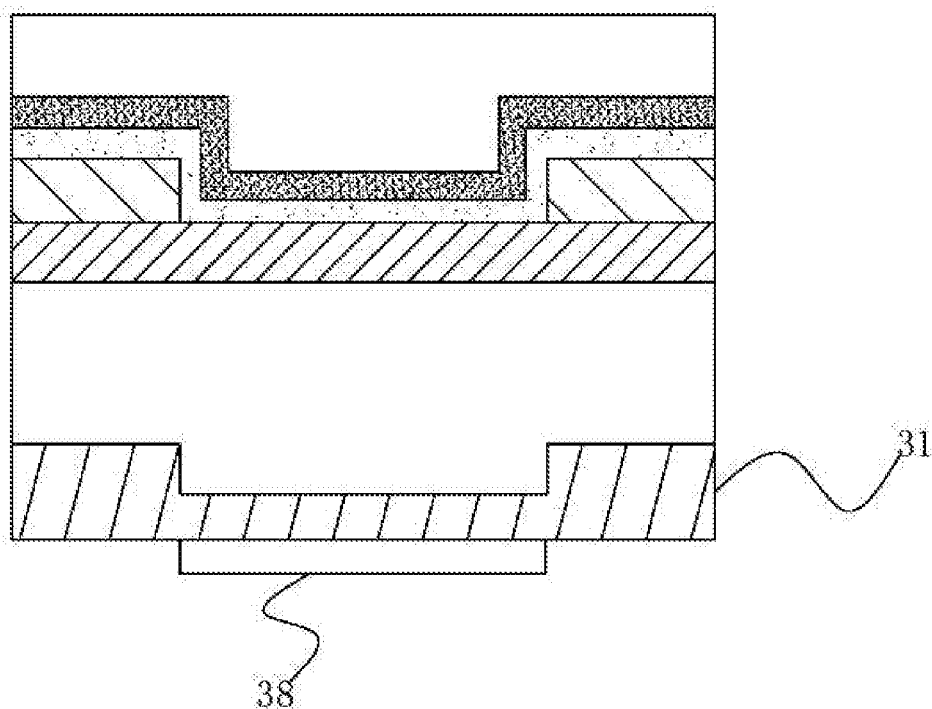
FIG. 7 is a schematic structural diagram of a display panel according to an embodiment 4 of the present invention.

A display panel, as shown in FIG. 7, which differs from the embodiment 1 in that a thickness of the base substrate 31 at a position corresponding to the through hole 39 is less than a thickness of another portion of the base substrate 31.

By thinning the thickness of the base substrate 31 at a position corresponding to the optical component 38, light transmittance at the position corresponding to the optical component 38 on the base substrate 31 is increased, thereby making the imaging of the optical component 38 such as a camera clearer.

It should be noted that, in FIG. 7, only the case where the covering layer 35 fills the through hole 39 is illustrated, and in actual implementation, on the premise that the thickness at the position corresponding to the through hole 39 on the base substrate 31 is less than that of another portion on the base substrate 31, the through hole 39 can also be filled in the protective layer 36 or the encapsulation layer 37.

Embodiment 5

According to the above display panel, the present invention also provides a mask plate used for fabricating the display panel as described above.

Figure 8:
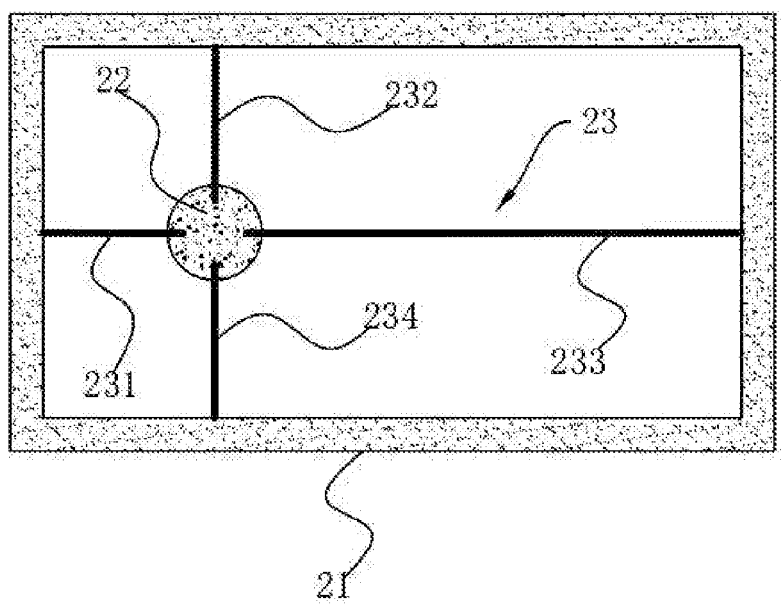
FIG. 8 is a schematic plan diagram of a mask plate according to an embodiment 5 of the present invention.

Specifically, as shown in FIG. 8, where the mask plate includes a ring-shaped frame 21, a blocking piece 22 positioned in a region enclosed by the frame 21 and corresponding to the through hole, and a connecting portion connecting the frame 21 with the blocking piece 22.

The blocking piece 22 has a laminating surface 221, and a side of the frame 21 at the same side as the laminating surface 221 is on the same level as the laminating surface 221.

When the cathode layer 34 is fabricated by vapor deposition on an entire surface, in the process of forming the cathode layer 34, the cathode layer 34 having the through hole 39 is formed by blocking effect of the blocking piece 22 on the mask plate, the position of the through hole 39 corresponds to the preset position, and the preset position is used to mount the optical component 38 such as a camera, thereby enhancing light transmittance at the preset position, while enabling the optical component 38 such as a camera to form images clearly.

Specifically, the connecting portion includes at least one connecting strip 23, an end of the connecting strip 23 is fixedly connected to the blocking piece 22, and the other end is fixedly connected to the frame 21.

Further, the frame 21 has a square shape, and at least one of the connecting strips 23 is connected to each side of the frame 21. Referring to FIG. 8, a first connecting strip 231, a second connecting strip 232, a third connecting strip 233, and a fourth connecting strip 234 are sequentially connected to the frame 21 clockwise.

The blocking piece 22 is fixedly connected to the frame 21 by the connecting strip 23, and the connecting strip 23 is provided on each side of the frame 21, thereby fixing the blocking piece 22 more stably.

It should be noted that, FIG. 8 illustrates only one connecting strip 23 connected to each side of the frame 21, in an actual implementation, two, three or more connecting strips 23 can be connected to each side of the frame 21; in practice, one or two or three sides of the frame 21 can be connected to one connecting strip 23, and remaining sides of the frame are connected with two, three or more connecting strips 23. In general, the larger the length and width of the frame 21, the more connecting strips 23 are connected to each side of the frame 21.

It should be noted that FIG. 8 showing only connection points of all the connecting strips 23 and the blocking piece 22 are different. In actual implementation, the connection points of all the connecting strips 23 and the blocking piece 22 can be positioned at the same place or the connection points of portions of the connecting strips 23 and the blocking piece 22 are positioned at the same place.

Figure 9:
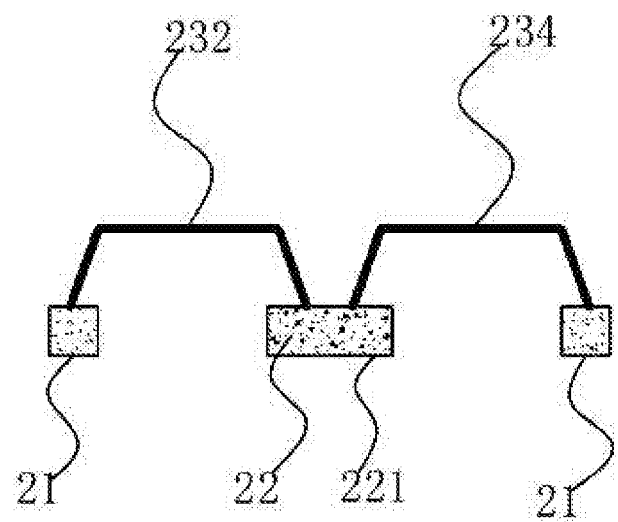
FIG. 9 to FIG. 10 are schematic structural diagrams of a connecting strip according to the embodiment 5 of the present invention.
Figure 10:
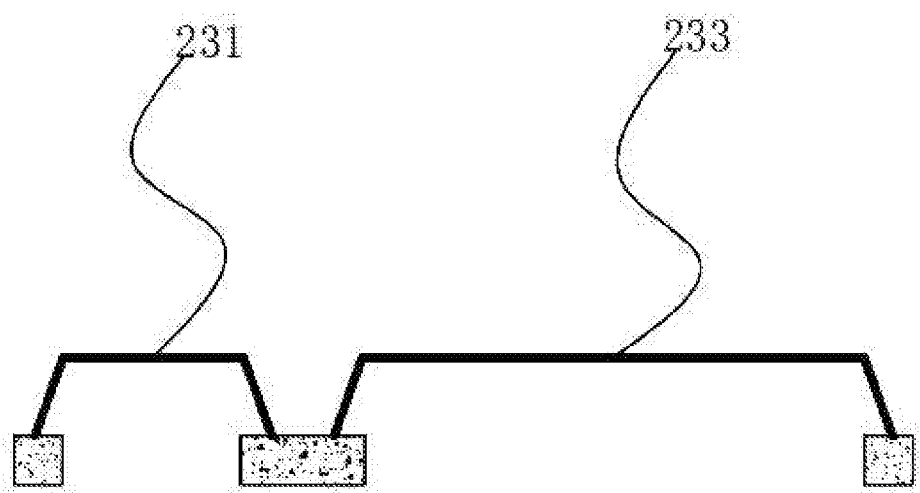

As shown in FIGS. 9 and 10, each connecting strip 23 protrudes away from the laminating surface 221.

The connecting strip 23 is disposed in a non-linear convex shape, and when the cathode layer 34 is formed by the vapor deposition process using the mask plate, a cathode material is not deposited at the preset position by the blocking piece 22, and the connecting strip 23, which is designed to protrude away from the laminating surface 221, ensures normal vapor deposition of the cathode layer 34 at a non-preset position, thereby preventing the connecting strip 23 from affecting the vapor deposition of the cathode layer 34 at a non-preset position.

Further, all the connection points of the connecting strips 23 and the blocking piece 22 are positioned on a side of the blocking piece 22 away from the laminating surface 221, and all the connection points of the connecting strips 23 and the frame 21 are positioned on a side of the frame 21 away from the laminating surface 221.

It should be noted that a shape of the cross section of the blocking piece 22 includes, but is not limited to, a circle, an ellipse or a polygon, and a shape of the longitudinal section of the blocking piece 22 includes, but is not limited to, a circle, an ellipse, and a polygon.

Referring to FIG. 10, in an embodiment, where the shape of the longitudinal section of each of the connecting strips 23 is regular trapezoid.

Figure 11:
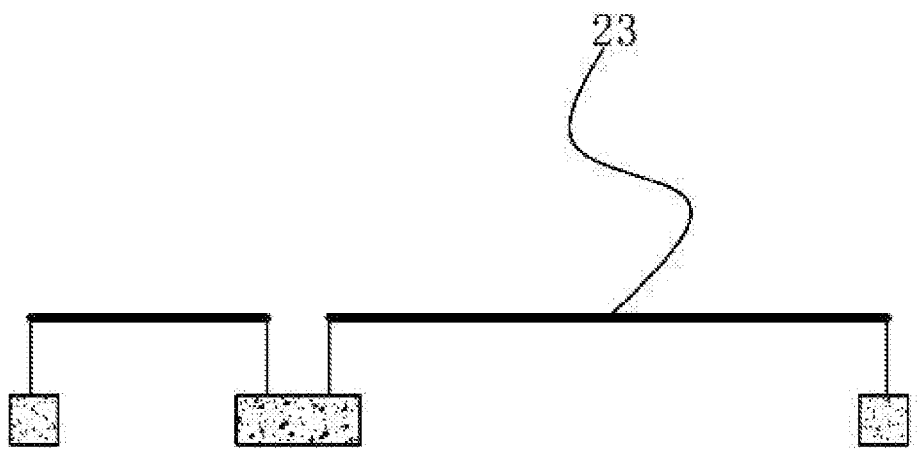
FIG. 11 is a schematic structural diagram of a connecting strip according to an embodiment of the present invention.

Referring to FIG. 11, in an embodiment, where the longitudinal section of each of the connecting strips 23 is a rectangular shape.

Figure 12:
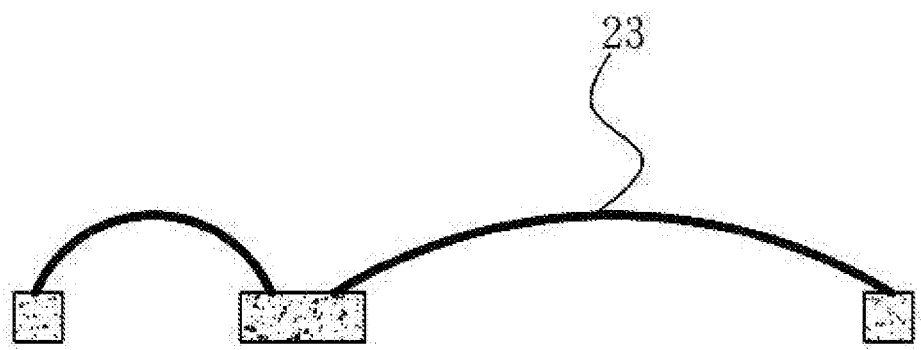
FIG. 12 is a schematic structural diagram of a connecting strip according to another embodiment of the present invention.

Referring to FIG. 12, in an embodiment, where the longitudinal section of each of the connecting strips 23 has an elliptical arc shape.

In the specific implementation, the shape of the longitudinal section of the connecting strip 23 can also be a circular arc shape or a polygonal shape.

Embodiment 6

Figure 13:
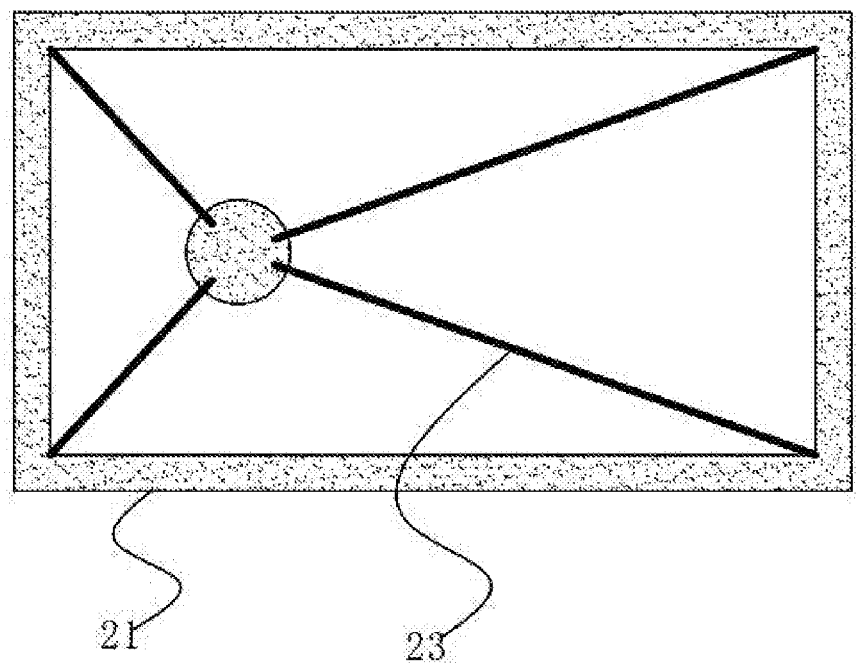
FIG. 13 is a plane diagram of a mask plate according to an embodiment 6 of the present invention.

A mask plate, as shown in FIG. 13, which differs from the embodiment 5 only in that the connection points of the connecting strips 23 and the frame 21 are different.

Specifically, each corner of the frame 21 is connected with a connecting strip 23, that is, a connection point of the connecting strip 23 and the frame 21 is at a corner of the frame 21.

Embodiment 7

Figure 14:
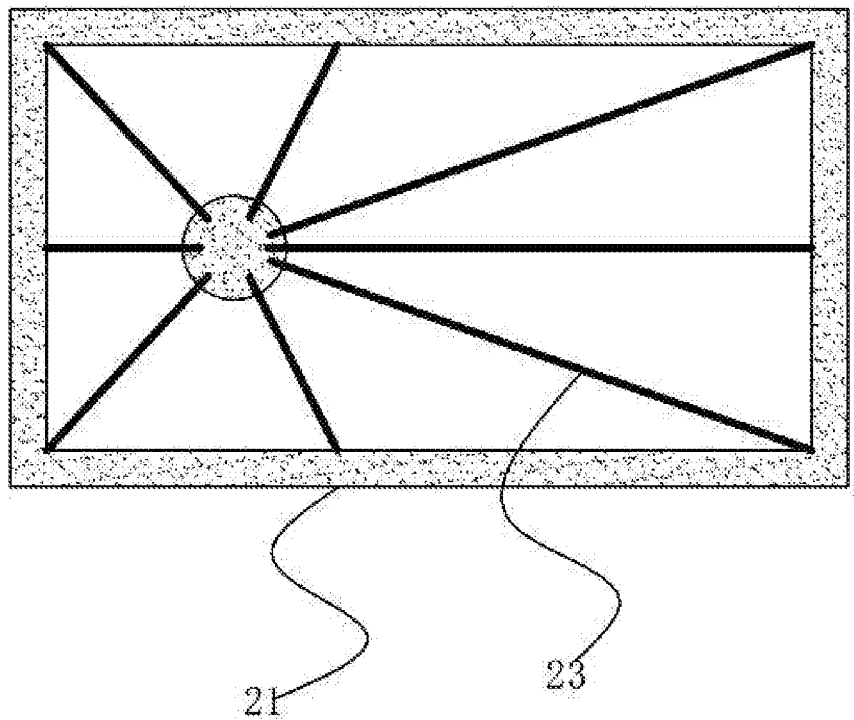
FIG. 14 is a plane diagram of a mask plate according to an embodiment 7 of the present invention.

A mask plate, as shown in FIG. 14, which differs from the embodiment 5 only in that the connection point of the connecting strip 23 and the frame 21 is different.

Specifically, each corner of the frame 21 is connected with one of the connecting strips 23, and at least one of the connecting strips 23 is connected to each side of the frame 21.

Embodiment 8

Figure 15:
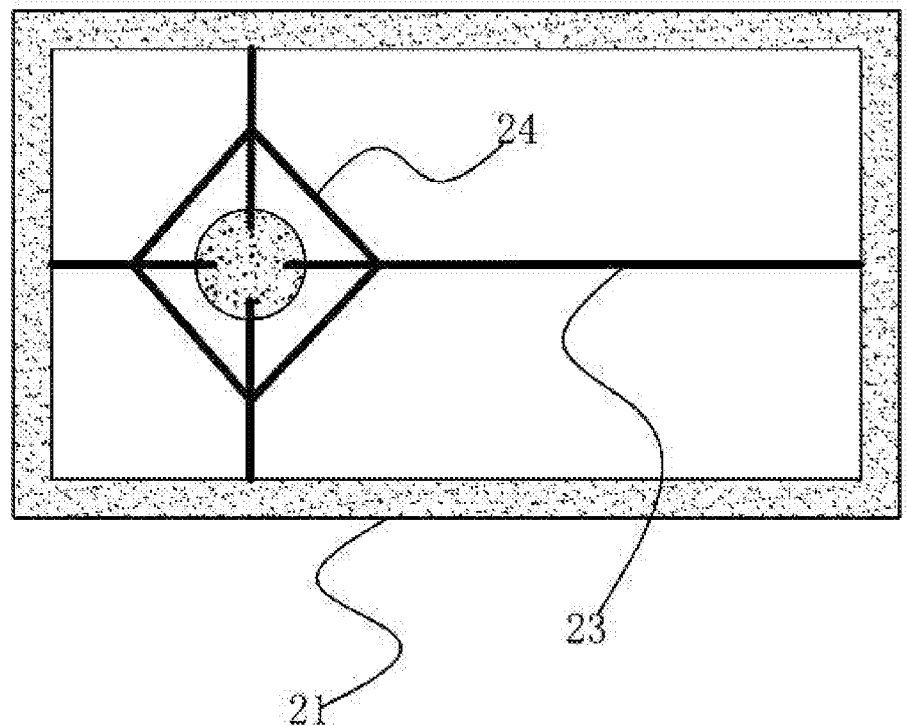
FIG. 15 is a plane diagram of a mask plate according to an embodiment 8 of the present invention.

A mask plate, as shown in FIG. 15, which differs from the embodiment 5 in that the mask plate further includes an auxiliary support bar 24, and one end of the auxiliary support bar 24 is fixedly connected with a connecting strip 23, and the other end is connected to another connecting strip 23. The overall structural strength of the mask plate is increased by the auxiliary support bar 24.

Embodiment 9

Based on the aforementioned mask plate and the aforementioned display panel, the present invention also provides a method for fabricating the display panel, including the following steps:

S10, providing a base substrate 31;

S20, forming a thin film transistor substrate 32 on the base substrate 31;

S30, forming a light-emitting layer 33 on the thin film transistor substrate 32;

S40, attaching a frame 21 of a mask plate to the light-emitting layer 33, simultaneously attaching a laminating surface 221 of a blocking piece 22 to the light-emitting layer 33, and adjusting position of the mask plate to make the blocking piece 22 positioned at a preset position;

S50, forming a cathode layer 34 on the light-emitting layer 33 by a vapor deposition process, wherein the cathode layer 34 has a through hole 39 corresponding to the blocking piece 22;

S60, forming a covering layer 35 and a protective layer 36 sequentially on the cathode layer 34;

S70, forming an encapsulation layer 37 on the protective layer 36.

Further, before the step S70, the method for fabricating the display panel further includes:

S80, after forming the cathode layer 34 or the covering layer 35 or the protective layer 36, removing the mask plate.

Among them, a sum of a thickness of the cathode layer 34, a thickness of the covering layer 35, and a thickness of the protective layer 36 is less than or equal to a thickness of the blocking piece 22.

In an embodiment, before the step S20, the method for fabricating the display panel further includes:

S90, processing a preset position on the base substrate 31 such that a thickness at the preset position on the base substrate 31 is less than a thickness of the other portions.

Taking the cathode layer 34 having the through hole 39 as an example, referring to FIG. 16 to FIG. 19, where FIG. 16 to FIG. 19 are schematic flowcharts of a process for fabricating a display panel according to an embodiment.

Figure 16:
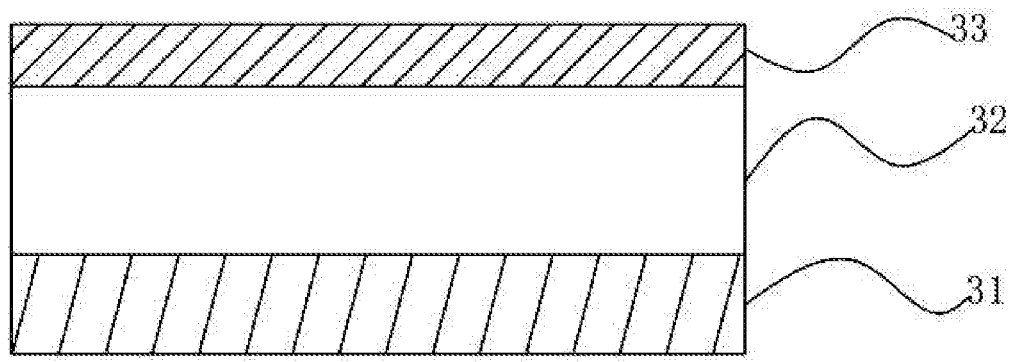
FIG. 16 to FIG. 19 are schematic flowcharts of a process for fabricating a display panel according to an embodiment of the present invention.

As shown in FIG. 16, after the thin film transistor substrate 32 is formed on the base substrate 31, a light-emitting layer 33 is formed on the thin film transistor substrate 32.

Figure 17:
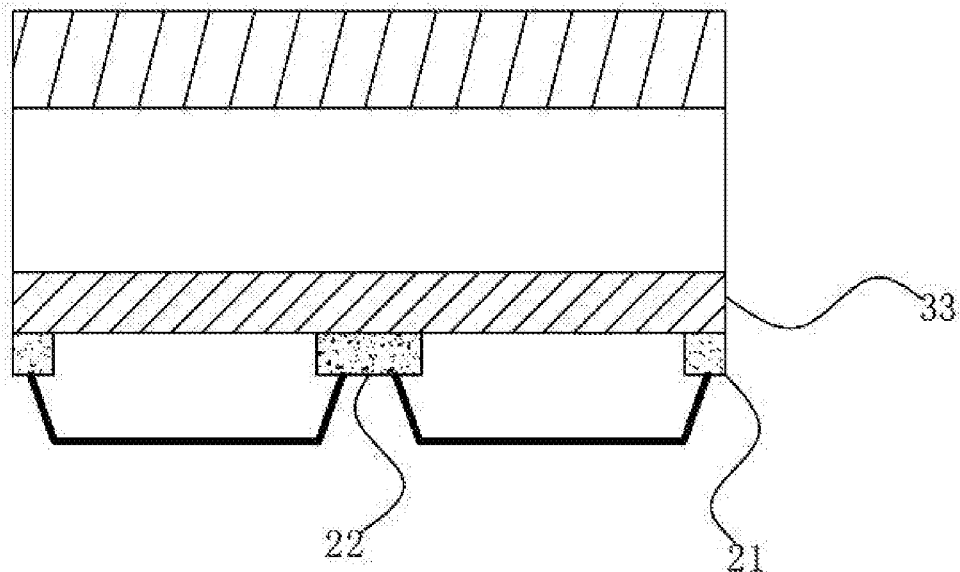

As shown in FIG. 17, the frame 21 of the mask plate is attached to the light-emitting layer 33, and the laminating surface 221 of the blocking piece 22 is attached to the light-emitting layer 33 to adjust the position of the mask plate such that the blocking piece 22 is positioned at the preset position, at which time the mask plate is positioned below the light-emitting layer 33.

Figure 18:
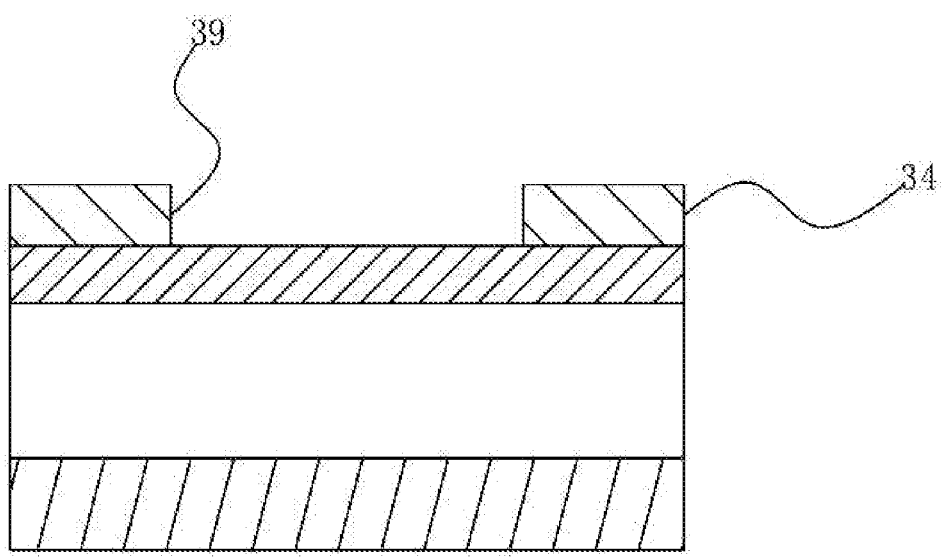

As shown in FIG. 18, a vapor deposition process is performed on the light-emitting layer 33. Due to the blocking function of the blocking piece 22 of the mask plate, the cathode material cannot fall into the preset position, and the cathode material normally falls into a non-preset position, thereby forming the cathode layer 34 having the through holes 39. Afterwards, the mask plate is removed, and the through hole 39 is positioned on the cathode layer 34 at a position corresponding to the preset position.

Figure 19:
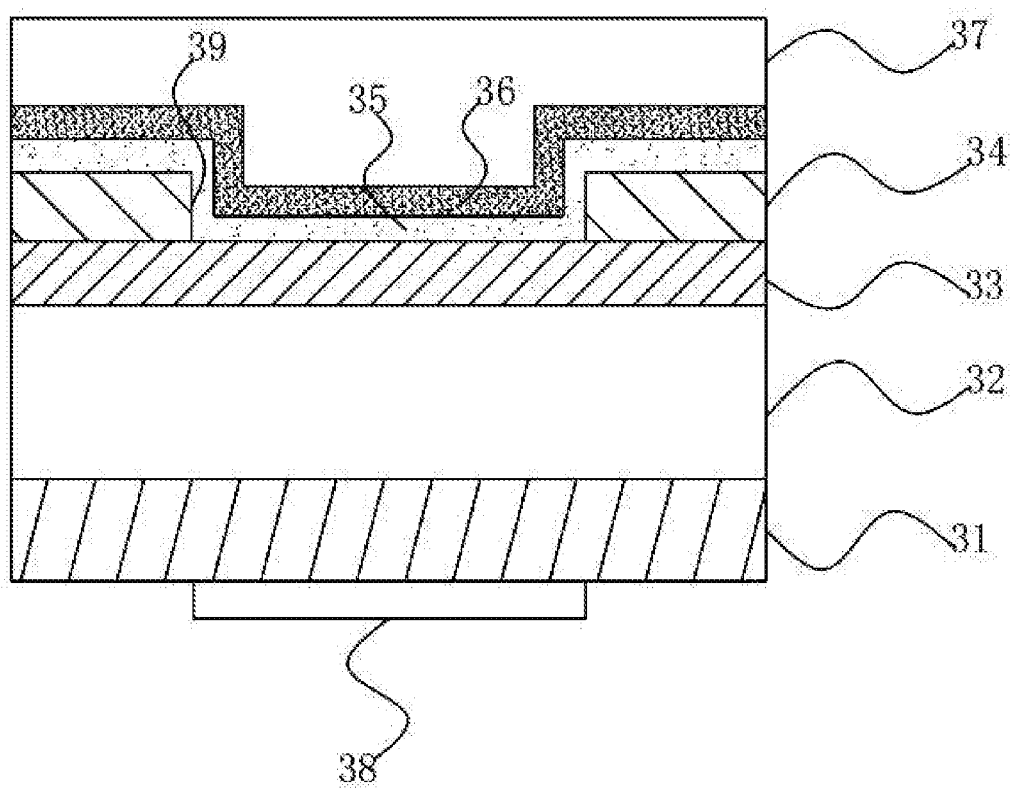

As shown in FIG. 19, where a covering layer 35 covering the cathode layer 34 is formed, and after forming a protective layer 36 covering the covering layer 35, an encapsulation layer 37 covering the protective layer 36 is formed, and a preset position on the base substrate 31 is formed. The optical component 38 is mounted at the preset position on the base substrate 31.

It should be noted that, in actual implementation, the cover layer 35 or the protective layer 36 that needs to be formed also has a through hole 39 corresponding to the preset position, and the position of the mask plate can remains the same after the formation of the cathode layer 34.

The beneficial effects of the present invention are as follows. When the vapor deposition process is performed using a mask plate to form one or more layers of a cathode layer 34, a covering layer 35, and a protective layer 36, the vapor deposition material is not deposited at the preset position by the mask plate, and the film layers can be formed normally in other areas. As a result, light transmittance at the preset position is enhanced so that optical components 38 such as a camera can form images clearly, which is simple and easily feasible. Simultaneously, the mask plate is used to complete the vapor deposition process of one or more of the cathode layer 34, the covering layer 35, and the protective layer 36 so that etching openings are not required to be formed on the formed film layers, that is, the fabricating process of the encapsulation layer 37 is not changed. Therefore, encapsulation reliability at the preset position is not reduced.

Embodiments of the present invention have been described, but not intending to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display panel, comprising:
   a base substrate;
   a thin film transistor substrate disposed on the base substrate;
   a light-emitting layer disposed on the thin film transistor substrate;
   a cathode layer disposed on the light-emitting layer, wherein the cathode layer is provided with a through hole penetrating the cathode layer;
   a covering layer and a protective layer laminated on the cathode layer; and
   an encapsulation layer disposed on the protective layer, wherein the through hole is filled with a transparent layer, the base substrate is a transparent base substrate, and the base substrate is made of transparent plastic or ultra-thin flexible glass.

2. The display panel according to claim 1, wherein a portion of the covering layer fills the through hole to serve as the transparent layer.

3. The display panel according to claim 1, wherein the through hole penetrates the covering layer, and a portion of the protective layer fills the through hole to serve as the transparent layer.

4. The display panel according to claim 1, wherein the through hole penetrates the covering layer and the protective layer, and a portion of the encapsulation layer fills the through hole to serve as the transparent layer.

5. The display panel according to claim 1, wherein a thickness of the base substrate at a position corresponding to the through hole is less than a thickness of another portion of the base substrate.

6. A display panel, comprising:
   a base substrate;
   a thin film transistor substrate disposed on the base substrate;
   a light-emitting layer disposed on the thin film transistor substrate;
   a cathode layer disposed on the light-emitting layer, wherein the cathode layer is provided with a through hole penetrating the cathode layer;
   a covering layer and a protective layer laminated on the cathode layer; and
   an encapsulation layer disposed on the protective layer, wherein the through hole is filled with a transparent layer.

7. The display panel according to claim 6, wherein a portion of the covering layer fills the through hole to serve as the transparent layer.

8. The display panel according to claim 6, wherein the through hole penetrates the covering layer, and a portion of the protective layer fills the through hole to serve as the transparent layer.

9. The display panel according to claim 6, wherein the through hole penetrates the covering layer and the protective layer, and a portion of the encapsulation layer fills the through hole to serve as the transparent layer.

10. The display panel according to claim 6, wherein a thickness of the base substrate at a position corresponding to the through hole is less than a thickness of another portion of the substrate.

11. A mask plate used for fabricating a display panel, wherein the display panel comprises:
    a base substrate;
    a thin film transistor substrate disposed on the base substrate;
    a light-emitting layer disposed on the thin film transistor substrate;
    a cathode layer disposed on the light-emitting layer, wherein the cathode layer is provided with a through hole penetrating the cathode layer;
    a covering layer and a protective layer laminated on the cathode layer; and
    an encapsulation layer disposed on the protective layer, wherein the through hole is filled with a transparent layer; and
    wherein the mask plate comprises a ring-shaped frame, a blocking piece positioned in a region enclosed by the ring-shaped frame and corresponding to the through hole, and a connecting portion connecting the ring-shaped frame with the blocking piece, wherein the blocking piece comprises a laminating surface, and a side of the ring-shaped frame at the same side as the laminating surface is on the same level as the laminating surface.

12. The mask plate according to claim 11, wherein the connecting portion comprises at least one connecting strip, an end of the connecting strip is fixedly connected to the blocking piece, the other end is fixedly connected to the ring-shaped frame, and each connecting strip protrudes away from the laminating surface.

13. The mask plate according to claim 12, wherein a connection point between each connecting strip and the blocking piece is positioned on a side of the blocking piece away from the laminating surface, and a connection point between each connecting strip and the ring-shaped frame is positioned on a side of the ring-shaped frame away from the laminating surface.

14. The mask plate according to claim 13, wherein each edge of the ring-shaped frame is connected to at least one of the connecting strips.

15. The mask plate according to claim 14, further comprising an auxiliary support bar, wherein an end of the auxiliary support bar is fixedly connected to one of the connecting strips, and the other end of the auxiliary support bar is connected to another connecting strip.

16. The mask plate according to claim 11, wherein a portion of the covering layer fills the through hole to serve as the transparent layer.

17. The mask plate according to claim 11, wherein the through hole penetrates the covering layer, and a portion of the protective layer fills the through hole to serve as the transparent layer.

18. The mask plate according to claim 11, wherein the through hole penetrates the covering layer and the protective layer, and a portion of the encapsulation layer fills the through hole to serve as the transparent layer.

19. The mask plate according to claim 11, wherein a thickness of the substrate at a position corresponding to the through hole is less than a thickness of another portion of the substrate.

* * * * *